United States Patent
Cho et al.

(10) Patent No.: US 7,390,706 B2
(45) Date of Patent: Jun. 24, 2008

(54) METHOD OF FORMING CHANNEL REGION OF TFT COMPOSED OF SINGLE CRYSTAL SI

(75) Inventors: Hans S. Cho, Seoul (KR); Takashi Noguchi, Seongnam-si (KR); Do-young Kim, Suwon-si (KR)

(73) Assignee: Samsung Electronics Co., Ltd., Suwon-Si, Gyeonggi-Do (KR)

( * ) Notice: Subject to any disclaimer, the term of this patent is extended or adjusted under 35 U.S.C. 154(b) by 239 days.

(21) Appl. No.: 11/289,312

(22) Filed: Nov. 30, 2005

(65) Prior Publication Data

US 2006/0154408 A1 Jul. 13, 2006

(30) Foreign Application Priority Data

Jan. 13, 2005 (KR) .................. 10-2005-0003193

(51) Int. Cl.
*H01L 21/84* (2006.01)
(52) U.S. Cl. .................. 438/166; 257/E21.561
(58) Field of Classification Search .......... 438/151–166
See application file for complete search history.

(56) References Cited

U.S. PATENT DOCUMENTS 3,853,648 A * 12/1974 Janus et al. ................. 216/55
6,632,708 B2 * 10/2003 Sakama et al. ............. 438/149
7,238,559 B2 * 7/2007 Cho .......................... 438/166

FOREIGN PATENT DOCUMENTS

JP 2002-313719 A 10/2002

OTHER PUBLICATIONS

Official Action issued by the Korean Intellectual Property Office in corresponding Korean Application No. 10-2005-0003193 on Sep. 22, 2006, and English-language translation thereof.

* cited by examiner

*Primary Examiner*—Richard A. Booth
(74) *Attorney, Agent, or Firm*—Buchanan, Ingersoll & Rooney PC

(57) ABSTRACT

A method of forming a high quality channel region of a TFT by forming a large size monocrystalline silicon thin film using a patterned metal mask and a grain boundary filtering region is provided. The method includes sequentially stacking a first buffer layer and an amorphous silicon layer on a substrate, forming a first silicon region in which crystallization begins, a second silicon region having a width smaller than a width of the first silicon region and located on a central portion of a side of the first silicon region, and a third silicon region having a width than greater the width of the second silicon region and contacting the second silicon region, forming a metal mask partly on the first silicon region, and crystallizing the amorphous silicon layer by cooling the amorphous silicon layer after melting the entire amorphous silicon layer except for a portion of the amorphous silicon layer under the metal mask by radiating laser beams to the patterned amorphous silicon layer.

21 Claims, 13 Drawing Sheets

METHOD OF FORMING CHANNEL REGION OF TFT COMPOSED OF SINGLE CRYSTAL SI

CROSS-REFERENCE TO RELATED PATENT APPLICATION

This application claims the benefit of Korean Patent Application No. 10-2005-0003193, filed on Jan. 13, 2005, in the Korean Intellectual Property Office, the disclosure of which is incorporated herein in its entirety by reference.

BACKGROUND OF THE DISCLOSURE

1. Field of the Disclosure

The present disclosure relates to a method of forming a channel region of a thin film transistor composed of monocrystalline silicon, and more particularly, to a method of forming a high quality channel region of a thin film transistor (TFT) by forming a large monocrystalline silicon thin film using a patterned metal mask and a grain boundary filter region.

2. Description of the Related Art

Of the elements that form a flat display device, such as a TFT LCD, the core element is the TFT which is a switching device. Generally, a channel of a TFT is formed of amorphous silicon or crystalline silicon obtained by crystallizing amorphous silicon. That is, as depicted in FIG. 1A, after forming a buffer layer 12 formed of silicon oxide on a substrate 11 formed of glass, silicon, or plastic, an amorphous silicon layer 13 is formed on the buffer layer 12. Next, a TFT 14 as depicted in FIG. 1B is formed by patterning and doping the amorphous silicon layer 13. In this case, a channel region of the TFT is amorphous silicon.

However, the high-speed operation of a device is difficult since amorphous silicon (a-Si) has low charge mobility. Accordingly, the amorphous silicon cannot be applied to a high-resolution display panel. To solve this problem, the TFT 14 depicted in FIG. 1B can be formed after forming polycrystalline silicon by crystallizing the amorphous silicon layer 13 depicted in FIG. 1A. In this case, a channel region of the TFT 14 is polycrystalline silicon. Polycrystalline silicon (poly-Si) has a charge mobility of more than 100 times faster than that of amorphous silicon (a-Si). Due to this advantage, a driving circuit can be built directly on a display panel. Therefore, manufacturing costs can be reduced and a slim and high-resolution large screen display can be produced.

Methods of crystallizing an amorphous silicon thin film deposited on a substrate are an excimer laser annealing (ELA) method and a solid phase crystallization (SPC) method. Recently, improved ELA methods, such as a metal induced lateral crystallization (MILC) method or a continuous grain solidification (CGS) method are also used. These are methods for crystallizing an amorphous silicon thin film to a polycrystalline silicon thin film.

However, even in the polycrystalline silicon thin film, the flow of charges is interrupted by many grain boundaries. Accordingly, to obtain superior electrical characteristics, the entire region on which a channel of a TFT is formed must be formed of monocrystalline silicon.

FIGS. 2A through 2C illustrate conventional methods of crystallizing silicon to form monocrystalline silicon, and FIG. 2D is a drawing illustrating a mask used in the crystallization methods of FIGS. 2A through 2C.

Referring to FIG. 2D, in a mask 15, a plurality of first and second apertures 16 and 17 having a rectangular shape spaced at a predetermined distance in a vertical direction are formed in two columns. As illustrated, the first and second apertures 16 and 17 are disposed in a zigzag shape.

After disposing this type of mask 15 a predetermined distance above amorphous silicon, the amorphous silicon under a region corresponding to the first and second apertures 16 and 17 melts when a laser beam is vertically irradiated through the mask 15. When the amorphous silicon irradiated by the laser beam is completely melted, the irradiation of the laser beam is terminated. Then, as depicted in FIG. 2A, crystallization begins from an outer boundary surface and proceeds toward an inner side of the melted amorphous silicon while the melted amorphous silicon is being cooled. At this time, a grain boundary of the silicon crystal proceeds in a direction of approximately 90° with respect to the outer boundary surface of the melted silicon. FIG. 3A is a photograph of a crystallized region indicated by "A" in FIG. 2A. Referring to FIG. 3A, the crystallization has proceeded from both an upper boundary surface and a lower boundary surface of melted silicon toward a central portion thereof. As a result, fine boundaries are vertically formed, and a bold grain boundary in a horizontal direction is formed at the central portion where crystallization from two directions meets at the central portion.

Next, as depicted in FIG. 2B, the mask 15 is horizontally moved, and the amorphous silicon between the regions on which the crystals have been formed is melted. That is, the amorphous silicon between the regions melted by laser beams passed through the second aperture 17 of the mask 15 in FIG. 2A is melted by laser beams passed through the first aperture 16 of the mask 15 in FIG. 2B. At this time, outer boundaries of the melted regions contact with or are partly overlapped by regions already crystallized in FIG. 2A. Then, the amorphous silicon is crystallized as depicted in FIG. 2C when the melts are slowly cooled by terminating the irradiation of the laser beams. That is, the crystallization proceeds continuously from crystals of the already crystallized region. FIG. 3B is a photograph of a crystallized region indicated by "B" in FIG. 2C. As depicted in FIG. 3B, large and continuous grains, in which grain boundaries are formed in one direction, are grown.

FIG. 4 is a cross-sectional view illustrating another conventional method of crystallizing silicon using an aluminum (Al) mask. Referring to FIG. 4, an amorphous silicon layer 21 is formed on an oxide substrate 20 such as silicon oxide, and a mask 23 formed of aluminum (Al) is partly formed on the amorphous silicon layer 21. Afterward, laser beams are vertically applied onto the amorphous silicon layer 21 using an excimer laser. Accordingly, a portion of the amorphous silicon layer 21 covered by the aluminum mask 23 is not melted and the remaining portion of the amorphous silicon layer 21 exposed to the laser beams is melted. When the irradiation of the laser beams is ended, crystallization proceeds from boundaries between the aluminum mask 23 and the amorphous silicon layer 21 inward to the melted amorphous silicon layer while heat is discharged rapidly through the aluminum mask 23, which has a relatively high thermal conductivity.

According to the method of crystallizing amorphous silicon described above, relatively large-sized of monocrystalline silicon can be obtained. However, this method cannot completely remove grain boundaries and many minute grain boundaries remain in the crystal. More specifically, the charge mobility in a vertical direction to the grain boundary is very low.

SUMMARY OF THE DISCLOSURE

The present invention may provide a method of forming a monocrystalline silicon thin film which is large and has almost no grain boundaries.

The present invention also may provide a method of forming a high-quality thin film channel region by forming a large size monocrystalline silicon thin film using a patterned metal mask and a grain boundary filter region.

According to an aspect of the present invention, there may be provided a method of forming a monocrystalline silicon thin film, comprising: sequentially stacking a first buffer layer and an amorphous silicon layer on a substrate; forming a first silicon region in which crystallization begins, a second silicon region having a width smaller than a width of the first silicon region and located on a central portion of a side of the first silicon region, and a third silicon region having a width greater than the width of the second silicon region and contacting the second silicon region by patterning the amorphous silicon layer; forming a metal mask partly on the first silicon region; and crystallizing the amorphous silicon layer by cooling the amorphous silicon layer after melting the entire amorphous silicon layer except for a portion of the amorphous silicon layer under the metal mask by radiating laser beams to the patterned amorphous silicon layer.

According to the present invention, a second buffer layer can be further formed between the metal mask and the first silicon region. In this case, the first and second buffer layers can include silicon oxide ($SiO_2$).

Also, the metal mask can have a polygon shape having an apex formed toward the second silicon region and can include chrome (Cr).

According to the present invention, the crystallization of melted amorphous silicon begins from edges of a metal mask in the first silicon region and proceeds to the second and third silicon regions and grain boundaries are formed in a direction vertical to each of the edges of the metal mask.

At least, pure monocrystalline silicon without grain boundaries can be formed in the second silicon region.

A reflection metal layer can be further formed on the metal mask, and the reflection metal layer can include aluminum Al.

A silicon nitride ($SiN_x$) can be further formed between the first buffer layer and the amorphous silicon layer to prevent the agglomeration of melted liquid silicon.

According to the present invention, the second silicon region can be formed in a direction vertical to a side of the first silicon region, or the second silicon region can be formed at an angle to a side of the first silicon region.

Also, a method of forming a TFT according to an aspect of the present invention can include forming a monocrystalline silicon thin film using the aforementioned method; removing the metal mask on the first silicon region; forming a source and a drain respectively by doping the first and third silicon regions; and forming a gate layer on the second silicon region, wherein second silicon region is the channel region between the source and the drain.

According to another aspect of the present invention, there is provided a method of forming a monocrystalline silicon thin film, comprising: sequentially stacking a first buffer layer, a silicon nitride layer, and an amorphous silicon layer on a substrate; forming a first silicon region in which crystallization begins, a second silicon region having a width smaller than a width of the first silicon region and located on a central portion of a side of the first silicon region, and a third silicon region having a width than greater the width of the second silicon region and contacting the second silicon region by patterning the amorphous silicon layer; sequentially forming a second buffer layer, a metal mask, and a reflection metal layer partly on the first silicon region; and crystallizing the amorphous silicon layer by cooling the amorphous silicon layer after melting the entire amorphous silicon layer except for a portion of the amorphous silicon layer under the metal mask by radiating laser beams to the patterned amorphous silicon layer.

BRIEF DESCRIPTION OF THE DRAWINGS

The above and other features and advantages of the present invention are described in greater detail exemplary embodiments thereof with reference to the attached drawings in which.

DETAILED DESCRIPTION OF EXEMPLARY EMBODIMENTS

The present invention will now be described more fully with reference to the accompanying drawings in which exemplary embodiments of the invention are shown.

Figure 1A:
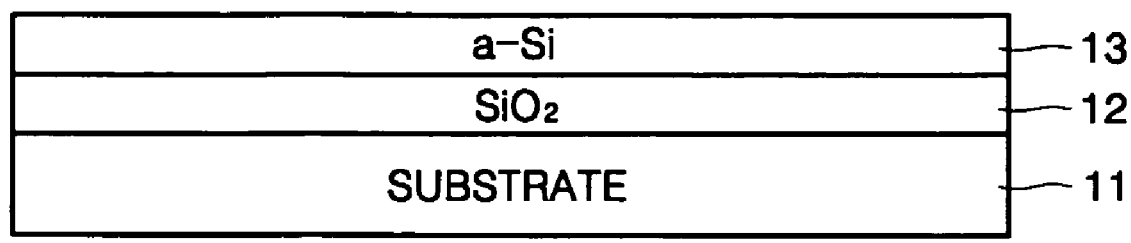
FIGS. 1A and 1B are cross-sectional views illustrating a conventional method of forming a thin film transistor (TFT)
Figure 1B:
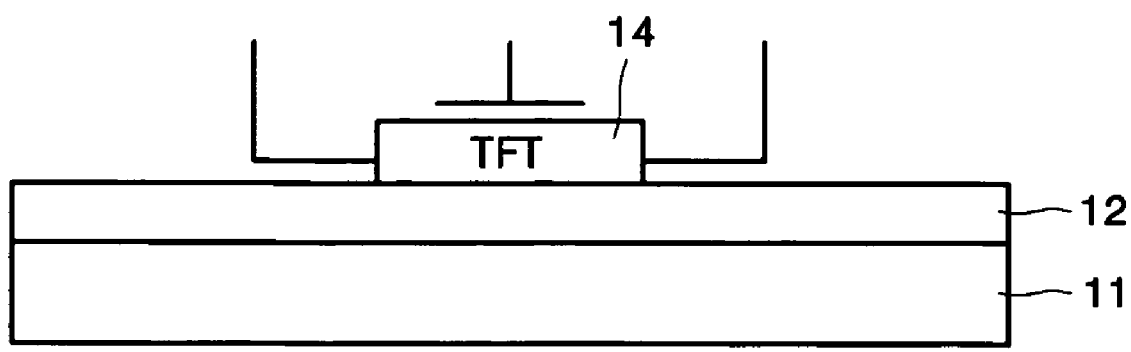
Figure 2A:
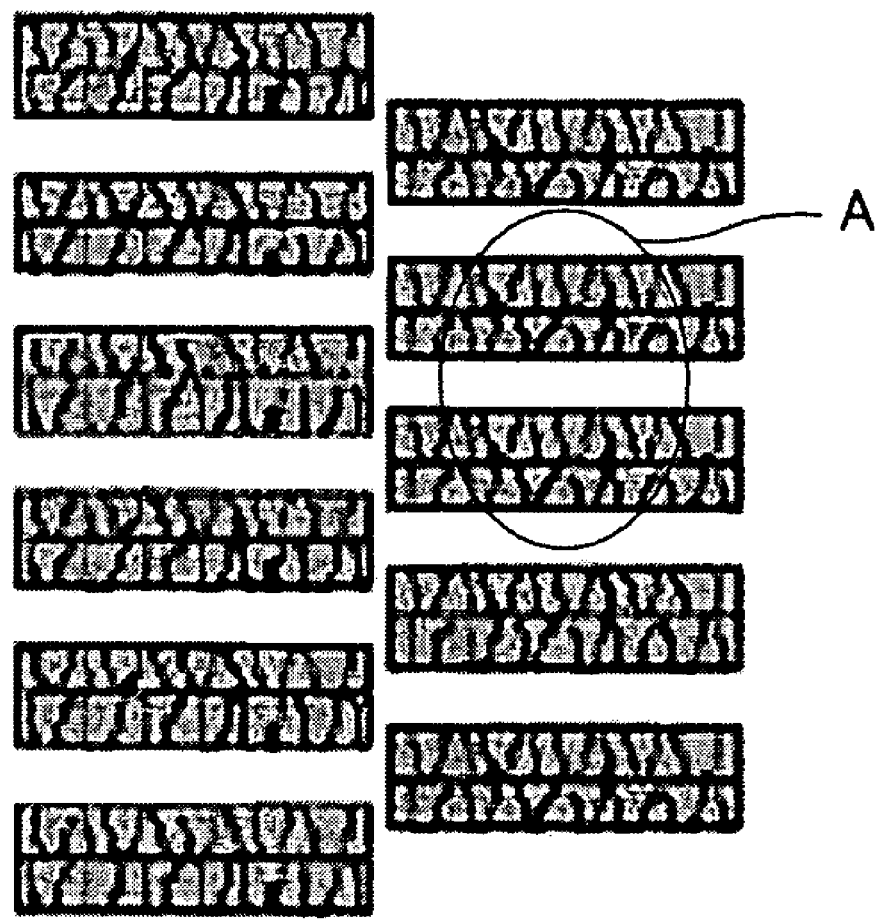
FIGS. 2A through 2C are drawings illustrating conventional methods of crystallizing silicon.
Figure 2B:
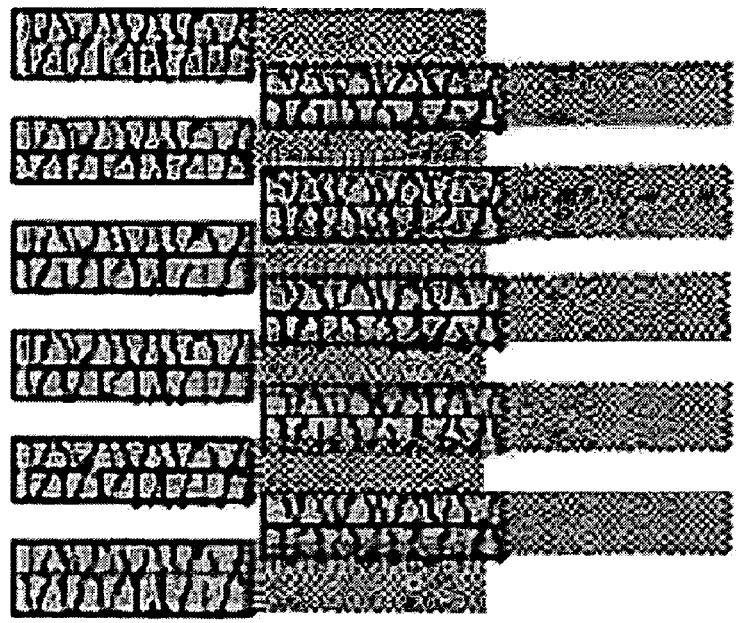
Figure 2C:
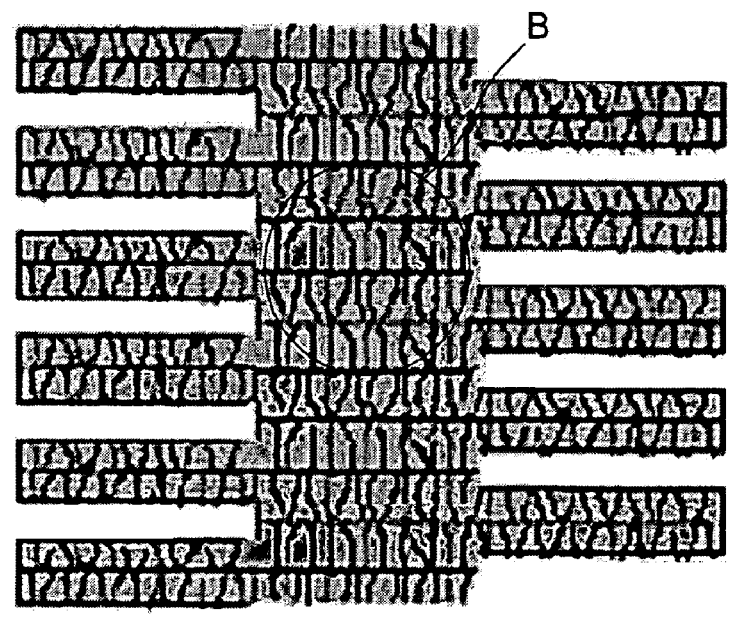
Figure 2D:
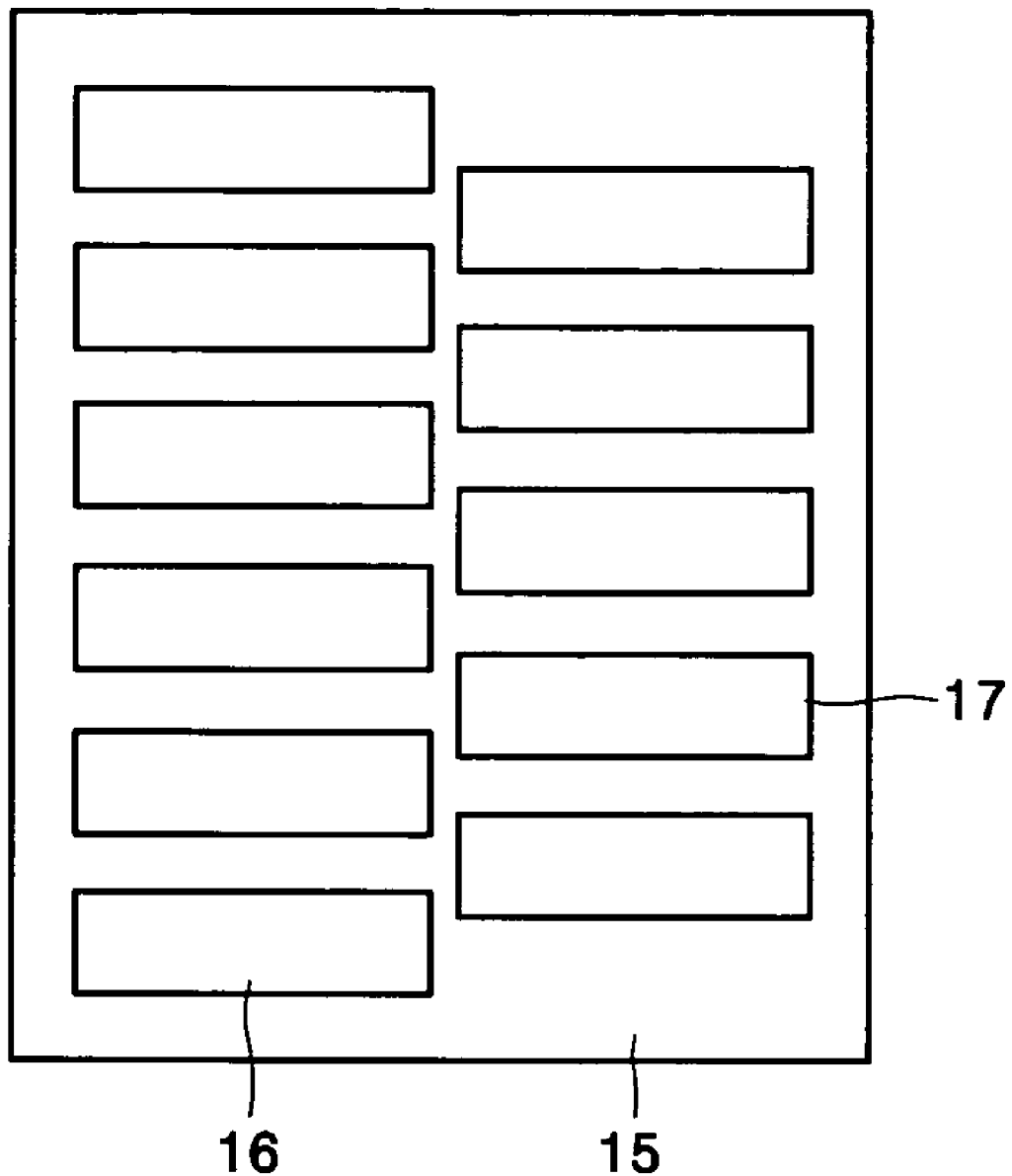
FIG. 2D is a drawing illustrating a mask used in the crystallization methods of FIGS. 2A through 2C.
Figure 3A:
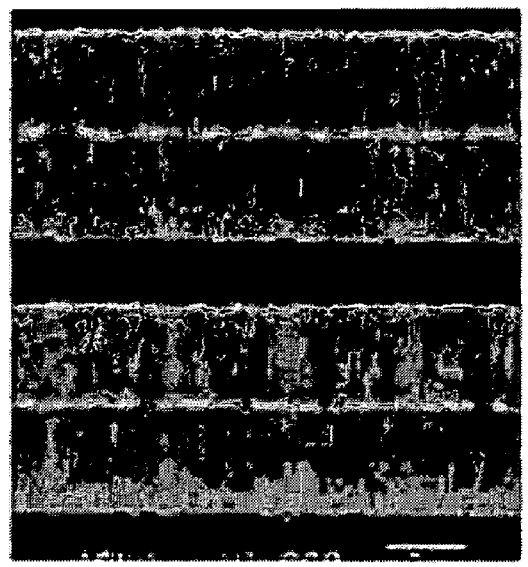
FIGS. 3A and 3B respectively are photographs taken after performing processes of 2A and 2C.
Figure 3B:
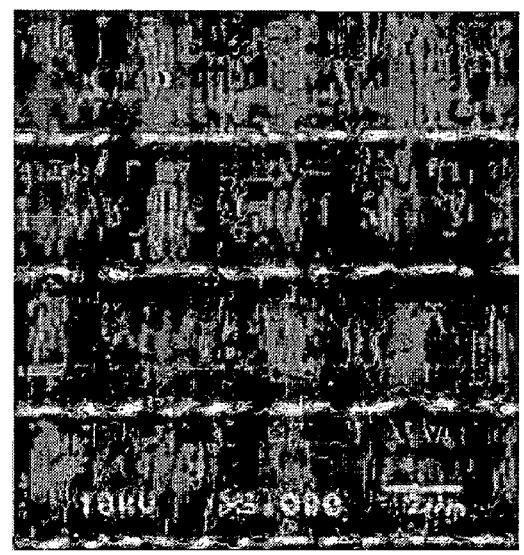
Figure 4:
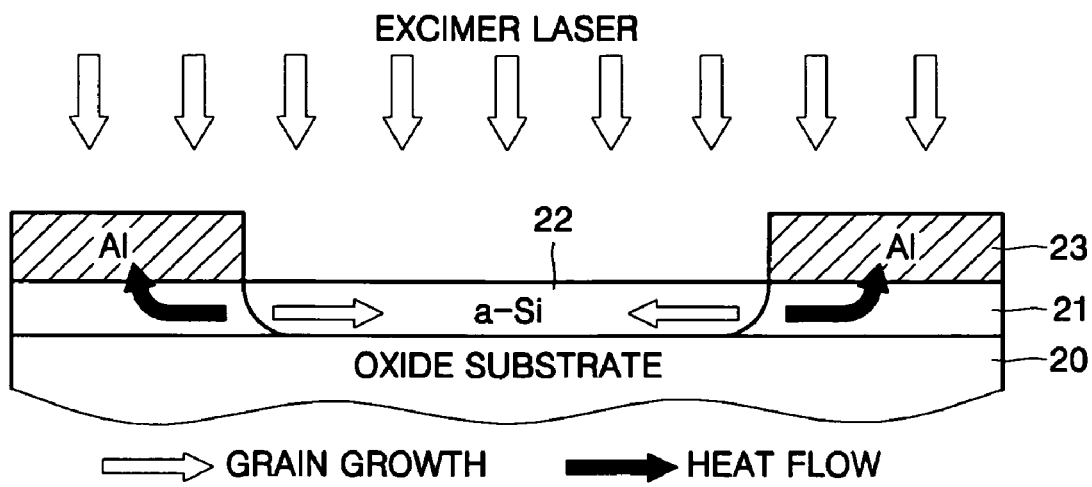
FIG. 4 is a cross-sectional view illustrating another conventional method of crystallizing silicon.
Figure 5A:
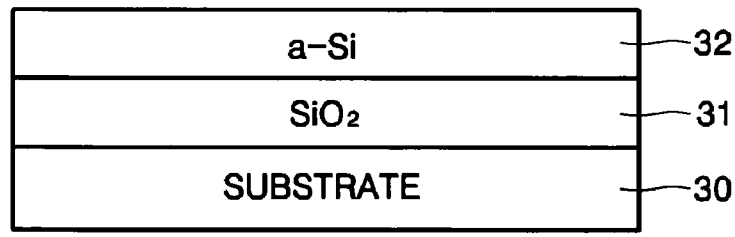
FIGS. 5A and 5B are cross-sectional views illustrating a structure of layers for crystallizing silicon according to an embodiment of the present invention.
Figure 5B:
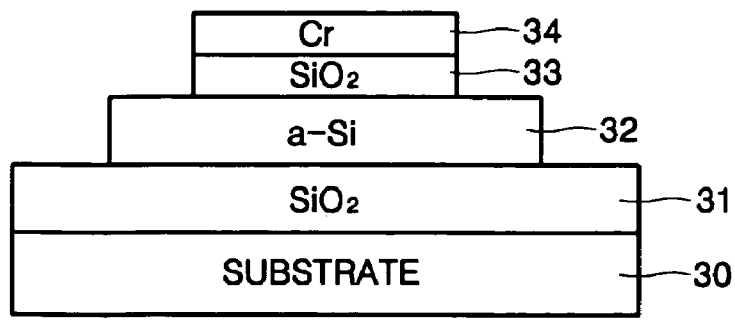

FIGS. 5A and 5B are cross-sectional views illustrating a structure of layers for crystallizing silicon according to an embodiment of the present invention, and FIGS. 6A through 6D are plan views illustrating a crystallization process according to an embodiment or the present invention.

Referring to FIG. 5A, a first buffer layer 31 is formed on a substrate 30, and an amorphous silicon layer 32 is formed on the first buffer layer 31. The substrate 30 can be formed of silicon, glass, or plastic, and the first buffer layer 31 can be formed of an insulating material such as $SiO_2$. Thereafter, the amorphous silicon layer 32 is patterned to have a shape depicted in FIG. 6A. The patterning of the amorphous silicon layer 32 can be performed using a conventional photolithography method. In accordance with a conventional crystallizing method, to form a TFT, polycrystalline silicon or monocrystalline silicon is patterned after crystallizing amorphous silicon. However, in the present invention, patterned amorphous silicon is crystallized after patterning amorphous silicon.

Figure 6A:
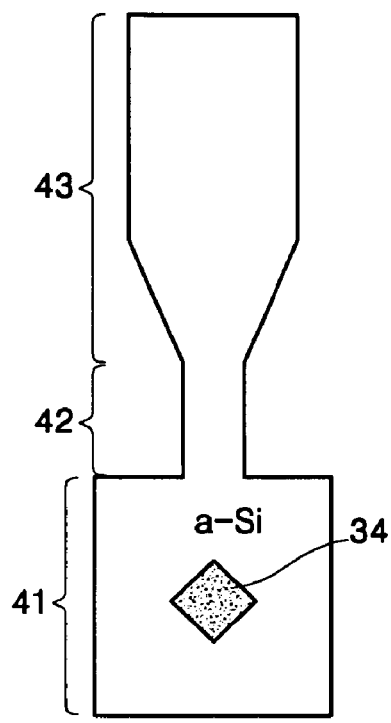
FIGS. 6A through 6D are plan views illustrating a crystallization process according to an embodiment or the present invention.

Referring to FIG. 6A, the patterned amorphous silicon layer 32 includes a first silicon region 41 in a rectangular shape from which crystallization will begin, a second silicon region 42 having a width smaller than that of the first silicon region 41 and extending from a central portion of a side of the first silicon region 41, and a third silicon region 43 having a width greater than that of the second silicon region 42. Accordingly, an overall view of the patterned amorphous silicon layer 32 has a dumbbell shape in which the second silicon region 42 is narrowed and the first and third silicon regions 41 and 43 have predetermined widths. As depicted in FIG. 6A, the third silicon region 43 can have a shape in which the width gradually increases from a boundary of the second silicon region 42 and remains uniform.

At this time, crystallization begins from the first silicon region 41 and proceeds toward the second and third silicon regions 42 and 43. That is, the first silicon region 41 is a region where crystallization begins, and the second silicon region 42 is a grain filtering region in which single crystals grow by shielding grain boundaries generated from the first silicon region 41. As described hereafter, after completing crystallization, a source or a drain of a TFT will be formed in the first and third silicon regions 41 and 43. The second silicon region 42 will be a channel region between the source and drain.

When the patterning of the amorphous silicon layer 32 is completed, as depicted in FIG. 6A, a metal mask 34 is partly formed in the first silicon region 41. The metal mask 34 can be formed of any metal that can shield or reflect a laser beam, but is preferably formed of chrome Cr which has high heat resistance. Also, prior to forming the metal mask 34, a second buffer layer is formed of an insulating material, such as $SiO_2$, and thereafter, the metal mask 34 can be formed on the second buffer layer.

The metal mask 34 forms a crystal nucleus so that the crystallization begins from the first silicon region 41. Also, the location of an apex of the metal mask 34 is very important. That is, the apex of the metal mask 34 must be placed at a location facing the second silicon region 42 so that grain boundaries generated during crystallization may not extend toward the second silicon region 42. The metal mask 34 depicted in FIG. 6A has a diamond shape, an apex of which is facing the second silicon region 42. However, the metal mask 34 can have any shape, such as a pointed or chevron shape 'Λ', an apex of which facing the second silicon region 42, or a triangle or a pentagon shape that covers the entire lower side of the first silicon region 41. At this time, an internal angle of the apex of the metal mask 34 is preferably in the range of approximately 10-120° because, if the internal angle is too large, grain boundaries vertical to both sides of the metal mask 34 may progress toward the second silicon region 42.

FIG. 5B illustrates a final layer structure formed in this way. As depicted in FIG. 5B, the first buffer layer 31, the patterned amorphous silicon layer 32, a second buffer layer 33, and the metal mask 34 are sequentially formed on the substrate 30.

When the patterning of the amorphous silicon layer 32 and the formation of the metal mask 34 are completed, laser beams are vertically radiated onto the entire amorphous silicon layer 32 from above the patterned amorphous silicon layer 32. For this purpose, an eximer laser can be used. The radiation of the laser is continued until the amorphous silicon layer 32 completely melts. Even though the overall amorphous silicon layer 32 melts by the radiation of laser beams, a portion of the amorphous silicon layer 32 placed under the metal mask 34 remains unmelted since the metal mask 34 shields the laser beams.

Figure 6B:
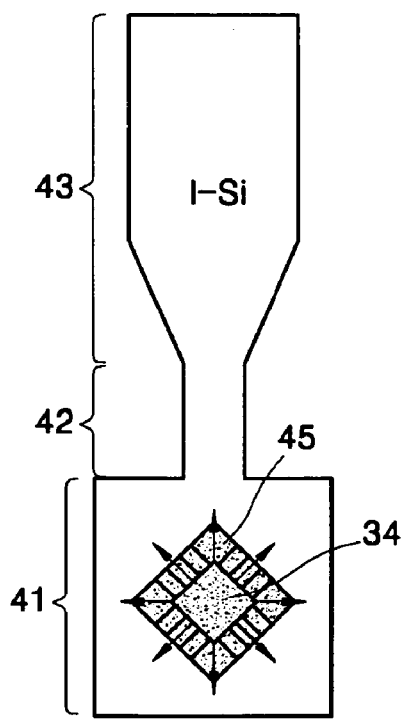

Accordingly, the unmelted amorphous silicon layer 32 under the metal mask 34 serves as crystal nuclei from which crystallization begins when the irradiation of the laser beams is ended. FIG. 6B is a plan view showing the beginning of crystallization at the periphery of the metal mask 34 when the radiation of the laser beams is terminated. As depicted in FIG. 6B, the crystallization of the melted liquid silicon (I-Si) progresses at a constant speed from each side of the metal mask 34, and grain boundaries are formed in a vertical direction to each side of the metal mask 34. However, almost no grain boundaries are generated from apexes of the metal mask 34.

Figure 6C:
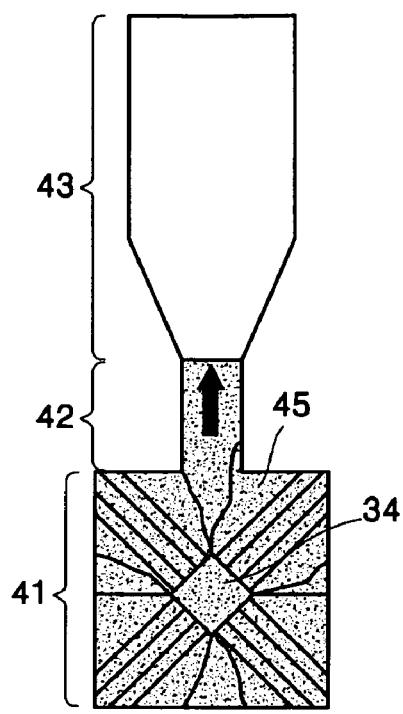
Figure 6D:
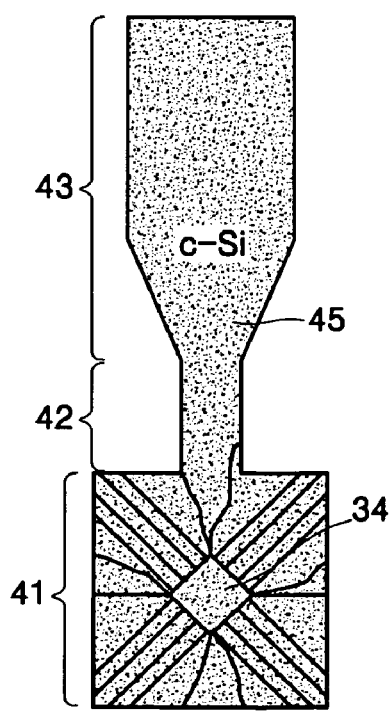

FIG. 6C is a plan view showing crystallization that has progressed up to the second silicon region 42, and FIG. 6D is a plan view showing the crystallization of the entire amorphous silicon layer. As depicted in FIG. 6C, almost all grain boundaries generated during the crystallization process extend aslant to the first silicon region 41 since grain boundaries are scarcely generated at the apex. Accordingly, the grain boundaries cannot reach the second silicon region 42, which is formed on a central portion of a side of the first silicon region 41. If the second silicon region 42 is long, the possibility that the grain boundaries pass through the second silicon region 42 is reduced. In this way, monocrystalline silicon having almost no grain boundaries can be formed from the second silicon region 42 to the third silicon region 43.

On the other hand, if the temperature of the third silicon region 43 is reduced to below approximately 1400° K before the crystallization that has started from the first silicon region 41 reaches the third silicon region 43, a plurality of crystal nuclei begin to be also formed in the third silicon region 43. Then, crystallization begins from the crystal nuclei in the third silicon region 43. Thus, the third silicon region 43 is polycrystalline silicon. The third silicon region 43 is not necessarily required to be complete monocrystalline silicon since the third silicon region 43 will be a region where a source or drain will be formed by doping. Therefore, it is not a serious concern that the third silicon region 43 be a polycrystalline silicon. However, a crystallization started in the third silicon region 43 must not progress to the second silicon region 42. For example, if the overall length of the patterned silicon layer 32 is approximately 10 μm, the crystallization started in the first silicon region 41 passes through the second silicon region 42 within approximately 100-500 ns since the crystallization velocity is conventionally approximately 10 m/s. Therefore, if the third silicon region 43 is sufficiently heated not to be cooled down below approximately 1400° K within the time of approximately 100-500 ns, almost perfect monocrystalline silicon can be formed in the second silicon region 42.

If the reflectance of a metal used to form the metal mask 34 is low, the metal mask 34 cannot sufficiently reflect the laser beams but absorbs heat generated from the laser beams. It is ideal that the amorphous silicon under the metal mask 34 remains unmelted and serves as crystal nuclei when the amorphous silicon cools down. However, in case the metal mask 34 cannot reflect heat but absorbs it, the amorphous silicon under the metal mask 34 may not serve as crystal nuclei when melted by the heat.

Figure 7A:
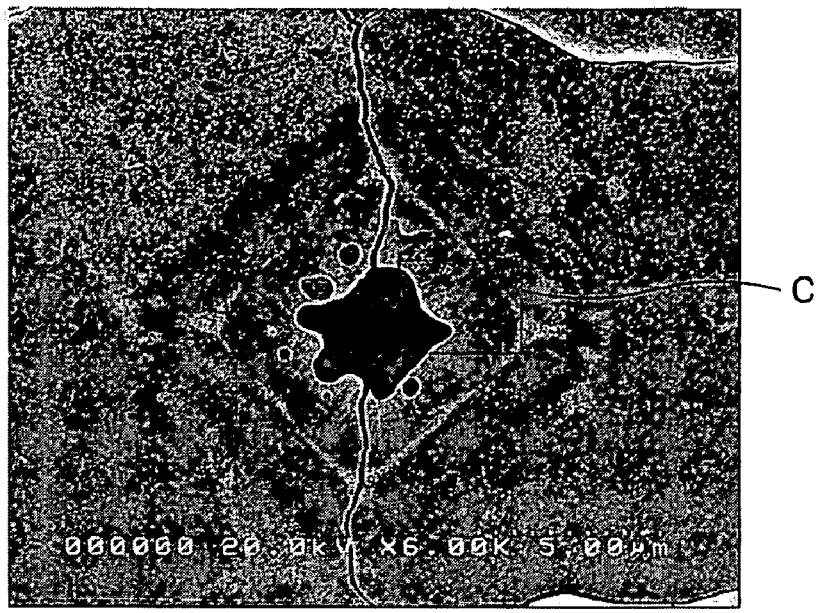
FIGS. 7A and 7B are SEM images showing a crystallization state around a metal mask.
Figure 7B:
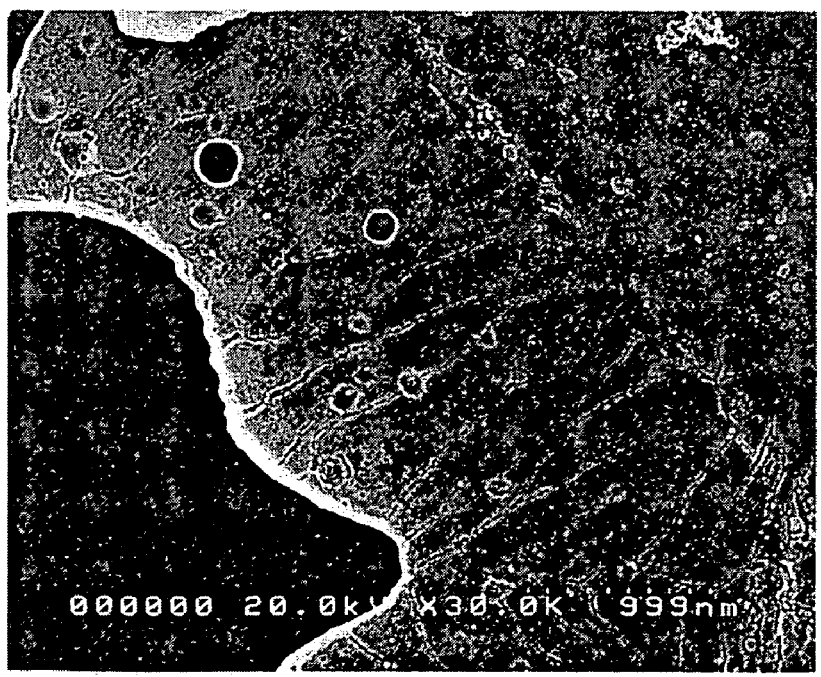

FIGS. 7A and 7B are SEM images that show a crystallization state of a silicon layer under the metal mask 34 formed of chrome Cr. Referring to FIG. 7A, a location is readily identified on which the metal mask 34 in a diamond shape existed. It is seen that, when the metal mask 34 is formed of Cr, almost the entire amorphous silicon under the metal mask 34 is melted. FIG. 7B is a magnified SEM image of a portion indicated by "C" in FIG. 7A. As shown in FIG. 7B, the crystallization of the amorphous silicon under the metal mask 34 has progressed inward of the metal mask 34 instead of outward of the metal mask 34 while the amorphous silicon was cooled after melting.

Therefore, there is a need to increase the reflectance of the metal mask 34, for example, to form the metal mask 34 of a metal having high reflectance, such as aluminum Al. However, when the metal mask 34 is formed of aluminum, the metal mask 34 also may be melted together with the amorphous silicon under the metal mask 34 if the metal mask 34 is exposed to high-intensity laser beams since aluminum has low thermal resistance.

Figure 8:
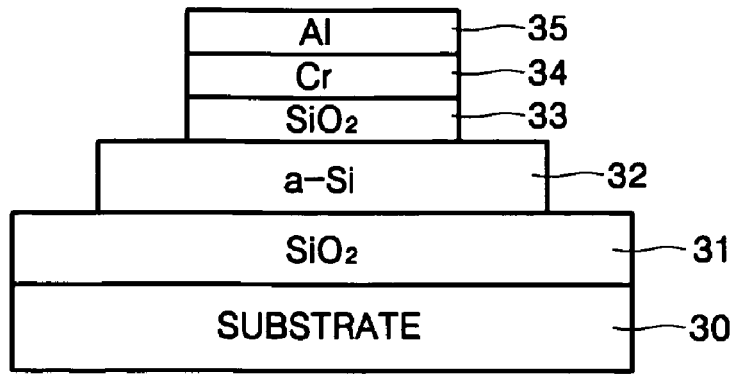
FIG. 8 is a cross-sectional view illustrating a structure of layers for crystallizing silicon according to another embodiment of the present invention.

FIG. 8 is a cross-sectional view illustrating a structure of layers for crystallizing silicon according to another embodiment of the present invention. Referring to FIG. 8, as in the previous embodiments, after forming a second buffer layer 33 and a metal mask 34 on an amorphous silicon layer 32, an additional reflection metal layer 35 for reflecting laser beams is formed on the metal mask 34. The metal mask 34 is formed of a metal having high thermal resistance, such as chrome Cr, and the reflection metal layer 35 is formed of a metal having high reflectance, such as aluminum Al. According to the above structure, the metal mask 34 is not heated and also the deformation of the metal mask 34 itself can be prevented, since the reflection metal layer 35 sufficiently reflects laser beams. Accordingly, the amorphous silicon under the metal mask 34 does not melt and can serve as crystal nuclei.

Figure 9A:
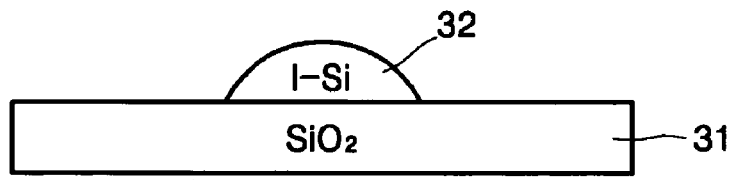
FIG. 9A is a cross-sectional view illustrating an agglomeration of silicon when an amorphous silicon layer formed directly on an silicon oxide buffer layer is liquefied.

On the other hand, when the amorphous silicon layer 32 is completely melted, surface tension is generated on the melted liquid silicon (l-Si). Also, liquid silicon (l-Si) on the first buffer layer 31 can easily flow since silicon oxide that forms the first buffer layer 31 has high interface energy with the melted liquid silicon. Therefore, as depicted in FIG. 9A, the molten silicon layer 32 on the first buffer layer 31 formed of silicon oxide may agglomerate toward a center of the original pattern of the amorphous silicon layer 32 due to the surface tension. As a result, if the amorphous silicon layer 32 is completely melted, the shape of the amorphous silicon layer 32 depicted in FIG. 6A may not be maintained.

Figure 9B:
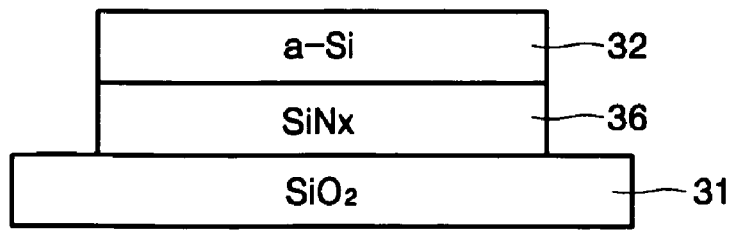
FIGS. 9B and 9C are cross-sectional views illustrating the mitigation of an agglomeration of silicon by forming a silicon nitride thin film between a silicon oxide buffer layer and an amorphous silicon layer.
Figure 9C:
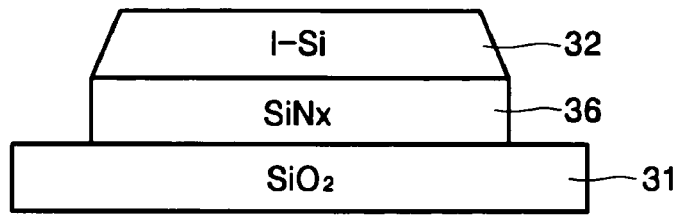

To avoid this problem, an agglomeration protection layer that has high adhesiveness with the melted liquid silicon and can prevent flowing and agglomeration of the liquid silicon needs to be formed between the first buffer layer 31 and the amorphous silicon layer 32. The agglomeration protection layer is preferably formed of a material having relatively low interface energy with the liquid silicon, such as silicon nitride $SiN_x$. FIG. 9B is a cross-sectional view illustrating a structure of layers in which a silicon nitride layer 36 is inserted between the first buffer layer 31 and the amorphous silicon layer 32. According to this structure, even if the amorphous silicon layer 32 is completely melted, as depicted in FIG. 9C, the melted liquid silicon is stably adhered on the silicon nitride layer 36 without flowing. Also, the formation of crystal nuclei in the liquid silicon can be suppressed since the silicon nitride layer 36 can cause the liquid silicon not to flow. Accordingly, the size of a region on which pure monocrystalline silicon can grow can be increased by disposing the silicon nitride layer 36 under the amorphous silicon layer 32.

Figure 10A:
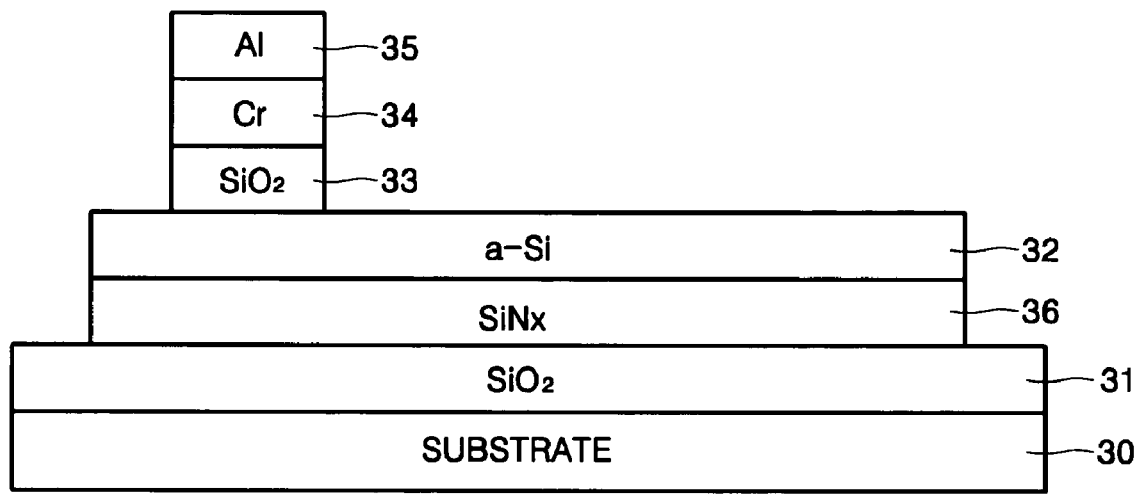
FIGS. 10A and 10B are cross-sectional views illustrating a structure of layers for crystallizing silicon according to another embodiment of the present invention.
Figure 10B:
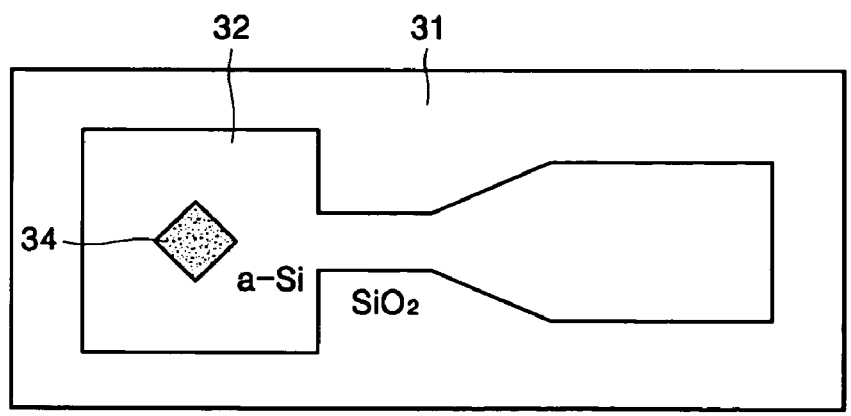

FIG. 10A is a cross-sectional views illustrating a structure of layers which include the reflection metal layer 35 and the silicon nitride layer 36, and FIG. 10B is a plan view of the structure of FIG. 10A. Referring to FIG. 10A, a first buffer layer 31 formed of silicon oxide is formed on a substrate 30 formed of silicon, glass, or plastic, and a silicon nitride layer 36 and an amorphous silicon layer 32 are sequentially formed on the first buffer layer 31. Here, the silicon nitride layer 36 and the amorphous silicon layer 32 are patterned to have the shape depicted in FIG. 10B. A second buffer layer 33 formed of silicon oxide, a metal mask 34 formed of chrome Cr, and the reflection metal layer 35 formed of aluminum Al are consecutively formed on a side of the amorphous silicon layer 32.

Figure 11:
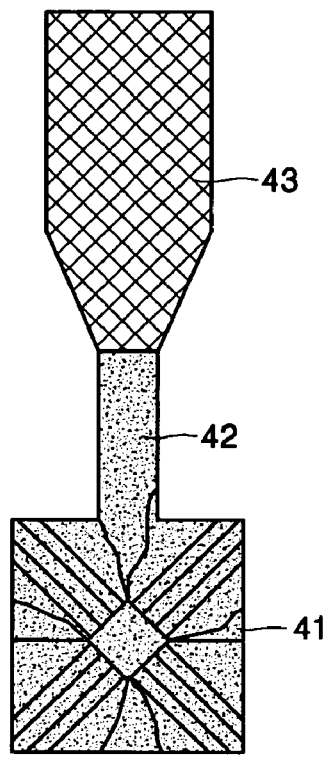
FIG. 11 is a plan view showing a monocrystalline silicon layer crystallized according to the present invention.

FIG. 11 is a plan view showing a monocrystalline silicon layer crystallized according to the present invention. As the crystallization process is completed, the first silicon region 41 is a polycrystalline silicon region having relatively large grain boundaries, the second silicon region 42 is a pure monocrystalline silicon region without grain boundaries, and the third silicon region 43 is a polycrystalline silicon region on which a plurality of irregular-sized small grain boundaries are formed. In FIG. 11, even though the third silicon region 43 is depicted as a polycrystalline silicon region, as described above, the third silicon region 43 can be a monocrystalline silicon region if the overall length of the amorphous silicon layer 32 is small or the temperature of the melted amorphous silicon layer 32 is sufficiently high.

Figure 12:
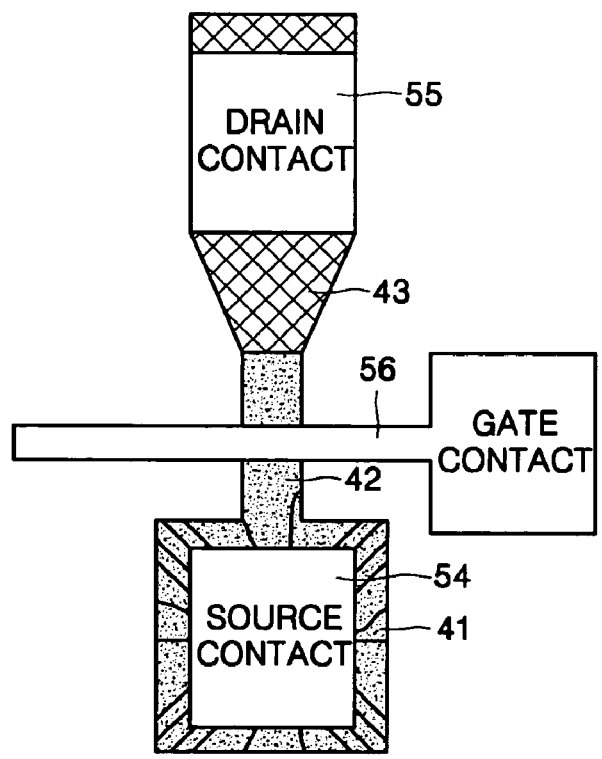
FIG. 12 is a plan view showing a TFT formed using a monocrystalline silicon layer crystallized according to the present invention.

As depicted in FIG. 12, the crystallized silicon layer can be used for manufacturing a TFT. For this purpose, the mask-related layers, namely, the second buffer layer 33, the metal mask 34, and the reflection metal layer 35 in the first silicon region 41, are removed. Afterward, the first silicon region 41 and the third silicon region 43 are doped with an n+ doapnt, and metal electrodes, such as aluminum Al are deposited on the doped first and third silicon regions 41 and 43 to form a source 54 and drain 55, respectively. In this case, the second silicon region 42 composed of pure monocrystalline silicon is a channel between the source 54 and the drain 55. Charge mobility in the second silicon region 42 is very high since the second silicon region 42 is a pure monocrystalline silicon region without grain boundaries. Therefore, the second silicon region 42 can serve as a channel having very high electrical characteristics. A TFT is completed by forming a gate 56 on the second silicon region 42.

Figure 13:
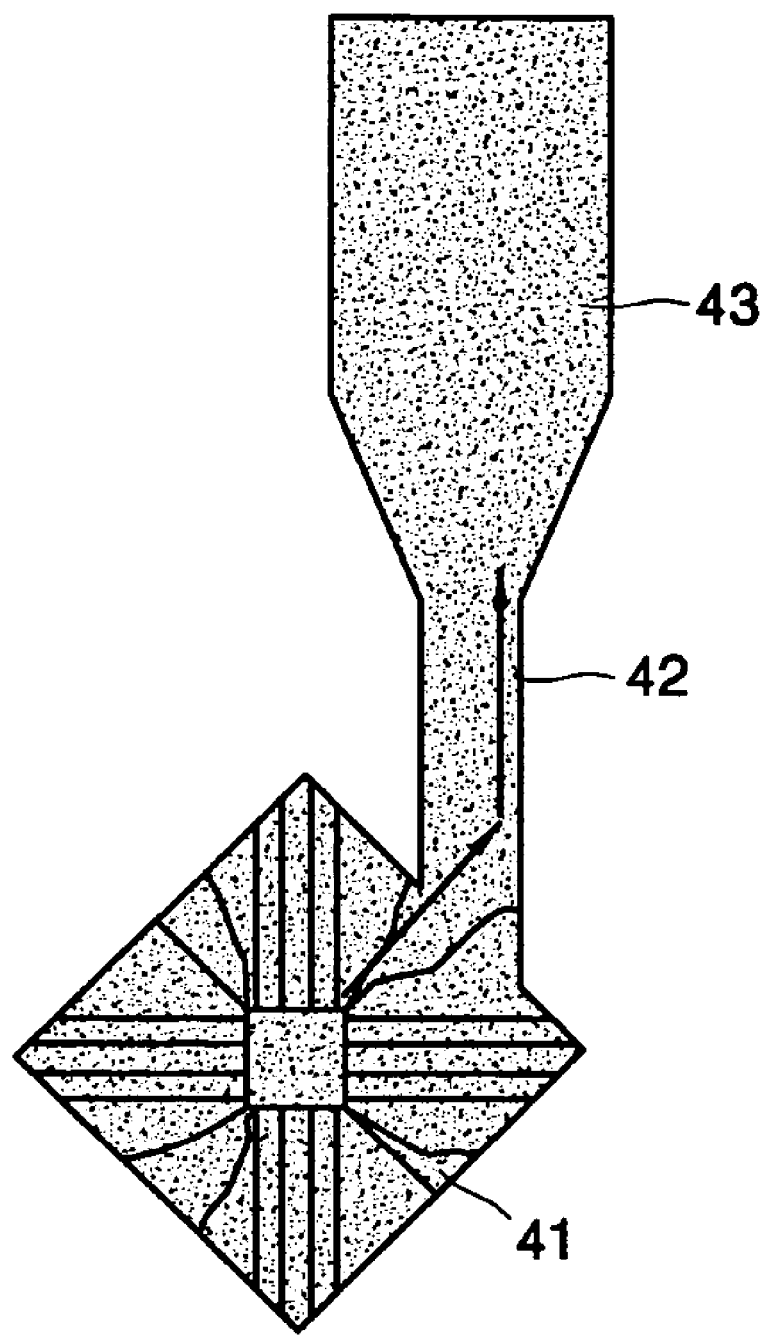
FIG. 13 is a plan view showing a silicon layer for crystallizing silicon according to still another embodiment of the present invention.

When the second silicon region 42 is formed vertically from a center of a side of the first silicon region 41 as depicted in FIG. 6A, a grain boundary accidentally formed on an apex of the metal mask 34 may reach the second silicon region 42. Under more severe conditions the grain boundary may pass through the second silicon region 42. In this instance, the charge mobility in the second silicon region 42 may be reduced, and the second silicon region 42 cannot be a pure monocrystalline silicon region. FIG. 13 is a plan view showing a silicon layer according to another embodiment of the present invention that is constructed to prevent the above problem. As depicted in FIG. 13, a second silicon region 42 having a narrow width is formed aslant to the first silicon region 41. In this case, even if a grain boundary generated at the apex of the metal mask 34 proceeds straight ahead, it only can reach an inlet of the second silicon region 42. Therefore, the grain boundary generated in the first silicon region 41 cannot reach or pass the second silicon region 42.

As described above, according to the present invention, a large monocrystalline silicon thin film having almost no grain boundaries can be formed in a simple method. Also, a high-quality TFT can be manufactured using the large monocrystalline silicon as a channel.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A method of forming a monocrystalline silicon thin film, comprising:
   sequentially stacking a first buffer layer and an amorphous silicon layer on a substrate;
   forming a first silicon region in which crystallization begins, a second silicon region having a width smaller than a width of the first silicon region and located on a central portion of a side of the first silicon region, and a third silicon region having a width than greater the width of the second silicon region and contacting the second silicon region, by patterning the amorphous silicon layer;
   forming a metal mask partly on the first silicon region; and
   crystallizing the amorphous silicon layer by cooling the amorphous silicon layer after melting the entire amorphous silicon layer except for a portion of the amorphous silicon layer under the metal mask by radiating laser beams to the patterned amorphous silicon layer.

2. The method of claim 1, wherein a second buffer layer is formed between the metal mask and the first silicon region.

3. The method of claim 2, wherein the first and second buffer layers include silicon oxide $SiO_2$.

4. The method of claim 1, wherein the metal mask has a polygon shape having an apex formed toward the second silicon region.

5. The method of claim 4, wherein the metal mask includes chrome Cr.

6. The method of claim 4, wherein the crystallization of melted amorphous silicon begins from edges of a metal mask in the first silicon region and proceeds to the second and third silicon regions, and grain boundaries are formed in a direction vertical to each of the edges of the metal mask.

7. The method of claim 6, wherein pure monocrystalline silicon without grain boundaries is formed at least in the second silicon region.

8. The method of claim 4, wherein a reflection metal layer is formed on the metal mask.

9. The method of claim 8, wherein the reflection metal layer includes aluminum Al.

10. The method of claim 1, wherein a silicon nitride layer $SiN_x$ is formed between the first buffer layer and the amorphous silicon layer to prevent the agglomeration of melted liquid silicon.

11. The method of claim 1, wherein the second silicon region is formed in a direction vertical to a side of the first silicon region.

12. The method of claim 1, wherein the second silicon region is formed aslant to a side of the first silicon region.

13. A method of forming a monocrystalline silicon thin film, comprising:
   sequentially stacking a first buffer layer, a silicon nitride layer, and an amorphous silicon layer on a substrate;
   forming a first silicon region in which crystallization begins, a second silicon region having a width smaller than a width of the first silicon region and located on a central portion of a side of the first silicon region, and a third silicon region having a width greater than the width of the second silicon region and contacting the second silicon region, by patterning the amorphous silicon layer;
   sequentially forming a second buffer layer, a metal mask, and a reflection metal layer partly on the first silicon region; and
   crystallizing the amorphous silicon layer by cooling the amorphous silicon layer after melting the entire amorphous silicon layer except for a portion of the amorphous silicon layer under the metal mask by radiating laser beams to the patterned amorphous silicon layer.

14. The method of claim 13, wherein the metal mask has a polygon shape having an apex formed toward the second silicon region.

15. The method of claim 13, wherein the metal mask includes chrome Cr and the reflection metal layer includes aluminum Al.

16. The method of claim 13, wherein the first and second buffer layers include silicon oxide $SiO_2$.

17. The method of claim 13, wherein the crystallization of melted amorphous silicon begins from edges of a metal mask in the first silicon region and proceeds to the second and third silicon regions, and grain boundaries are formed in a direction vertical to each of the edges of the metal mask.

18. The method of claim 17, wherein pure monocrystalline silicon without grain boundaries is formed at least in the second silicon region.

19. The method of claim 13, wherein the second silicon region is formed in a direction vertical to a side of the first silicon region.

20. The method of claim 13, wherein the second silicon region is formed aslant to a side of the first silicon region.

21. A method of manufacturing a TFT comprising:
   forming a monocrystalline silicon thin film using the method of claim 1;
   removing the metal mask from the first silicon region;
   forming a source and a drain respectively on the first and third silicon regions by doping the first and second regions with an n+ dopant; and
   forming a gate layer on the second silicon region, and the second silicon region is the channel region between the source and the drain.

* * * * *